(12) United States Patent
Melanson et al.

(10) Patent No.: US 9,571,931 B1
(45) Date of Patent: Feb. 14, 2017

(54) SYSTEMS AND METHODS FOR REDUCING NON-LINEARITIES OF A MICROPHONE SIGNAL

(71) Applicant: Cirrus Logic, Inc., Austin, TX (US)

(72) Inventors: John L. Melanson, Austin, TX (US); John C. Tucker, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 53 days.

(21) Appl. No.: 14/247,987

(22) Filed: Apr. 8, 2014

Related U.S. Application Data

(60) Provisional application No. 61/810,075, filed on Apr. 9, 2013.

(51) Int. Cl.
| | |
|---|---|
| *H04R 3/02* | (2006.01) |
| *H04R 3/00* | (2006.01) |
| *H04R 29/00* | (2006.01) |
| *H04R 19/04* | (2006.01) |

(52) U.S. Cl.
CPC ............. *H04R 3/02* (2013.01); *H04R 3/007* (2013.01); *H04R 29/001* (2013.01); *H04R 3/00* (2013.01); *H04R 3/002* (2013.01); *H04R 19/04* (2013.01)

(58) Field of Classification Search
CPC ............ H04R 3/02; H04R 3/007; H04R 3/00; H04R 29/001; H04R 3/002; H04R 19/04
See application file for complete search history.

(56) References Cited

U.S. PATENT DOCUMENTS

| | | | |
|---|---|---|---|
| 4,631,749 A * | 12/1986 | Rapaich | ............... 381/103 |
| 5,243,345 A | 9/1993 | Naus et al. | |
| 5,247,210 A | 9/1993 | Swanson | |
| 5,603,088 A | 2/1997 | Gorday et al. | |
| 6,566,942 B2 | 5/2003 | Shigenobu | |
| 6,724,332 B1 | 4/2004 | Melanson | |
| 6,738,004 B2 | 5/2004 | Melanson | |
| 6,809,572 B2 | 10/2004 | Yi et al. | |
| 6,822,594 B1 | 11/2004 | Melanson et al. | |
| 6,879,275 B1 | 4/2005 | Melanson | |
| 6,933,871 B2 | 8/2005 | Melanson et al. | |
| 6,956,919 B2 | 10/2005 | Amar et al. | |
| 7,081,843 B2 | 7/2006 | Melanson | |
| 7,084,798 B2 | 8/2006 | Melanson | |

(Continued)

FOREIGN PATENT DOCUMENTS

| | | |
|---|---|---|
| CN | 105264777 A | 1/2016 |
| EP | 0173983 A2 | 3/1986 |

(Continued)

OTHER PUBLICATIONS

International Search Report and Written Opinion, International Application No. PCT/US2014/033314, Nov. 7, 2014, 17 pages.

(Continued)

*Primary Examiner* — Andrew L Sniezek
(74) *Attorney, Agent, or Firm* — Jackson Walker L.L.P.

(57) ABSTRACT

To correct for non-linearities in the response of a microphone as a function of sound pressure level incident upon the microphone, a displacement non-linearity function is applied to the signal path of the microphone, wherein the displacement non-linearity function is a function of the digital audio output signal and has a response modeling non-linearities of the displacement as a function of a sound pressure level incident upon the microphone.

10 Claims, 1 Drawing Sheet

(56) References Cited

U.S. PATENT DOCUMENTS

| | | | |
|---|---|---|---|
| 7,110,460 | B1 | 9/2006 | Melanson et al. |
| 7,116,721 | B1 | 10/2006 | Melanson et al. |
| 7,138,934 | B2 | 11/2006 | Melanson |
| 7,148,830 | B2 | 12/2006 | Melanson |
| 7,164,379 | B1 | 1/2007 | Rao |
| 7,170,434 | B2 | 1/2007 | Melanson |
| 7,183,957 | B1 | 2/2007 | Melanson |
| 7,187,312 | B2 | 3/2007 | Melanson |
| 7,190,294 | B2 | 3/2007 | Melanson |
| 7,196,647 | B2 | 3/2007 | Melanson |
| 7,205,917 | B2 | 4/2007 | Magrath |
| 7,298,305 | B2 | 11/2007 | Melanson |
| 7,358,881 | B2 | 4/2008 | Melanson |
| 7,450,047 | B1 | 11/2008 | Wu |
| 7,649,484 | B1 | 1/2010 | Wegener |
| 8,396,230 | B2 | 3/2013 | Chang et al. |
| 8,890,051 | B2 | 11/2014 | Funakoshi |
| 8,907,829 | B1 | 12/2014 | Naderi |
| 9,076,554 | B1 | 7/2015 | Zanchi |
| 9,332,345 | B1 | 5/2016 | Melanson et al. |
| 9,419,562 | B1 | 8/2016 | Melanson et al. |
| 2001/0014122 | A1 | 8/2001 | Fu et al. |
| 2007/0127761 | A1 | 6/2007 | Poulsen |
| 2009/0278721 | A1 | 11/2009 | Hamashita |
| 2009/0295615 | A1 | 12/2009 | Steiner |
| 2010/0057474 | A1 | 3/2010 | Kong |
| 2011/0112668 | A1 | 5/2011 | Sorensen et al. |
| 2011/0150260 | A1* | 6/2011 | Miles ............... 381/360 |
| 2012/0128181 | A1 | 5/2012 | Lin et al. |
| 2012/0224722 | A1* | 9/2012 | Nystrom ............ 381/111 |
| 2013/0051582 | A1 | 2/2013 | Kropfitsch et al. |
| 2013/0058495 | A1 | 3/2013 | Furst |
| 2013/0108074 | A1* | 5/2013 | Reining ............. 381/92 |
| 2013/0271307 | A1 | 10/2013 | Kropfitsch et al. |
| 2013/0335131 | A1 | 12/2013 | Ceballos et al. |
| 2014/0140538 | A1 | 5/2014 | Kropfitsch et al. |
| 2014/0301571 | A1 | 10/2014 | Melanson et al. |
| 2014/0301572 | A1 | 10/2014 | Melanson et al. |
| 2014/0323844 | A1 | 10/2014 | Deliwala |
| 2014/0341397 | A1 | 11/2014 | Straeussnigg et al. |
| 2015/0086043 | A1 | 3/2015 | Sridharan et al. |
| 2015/0380005 | A1 | 12/2015 | Chesney |

FOREIGN PATENT DOCUMENTS

| | | | |
|---|---|---|---|
| EP | 2421281 | A2 | 2/2012 |
| EP | 2984759 | A2 | 2/2016 |
| EP | 2984760 | A2 | 2/2016 |
| GB | 2459862 | A | 11/2009 |
| GB | 2459864 | A | 11/2009 |
| GB | 2508612 | A | 6/2014 |
| GB | 2513406 | A | 10/2014 |
| GB | 2530605 | A | 3/2016 |
| WO | 2013182901 | A1 | 12/2013 |
| WO | 2014168934 | A2 | 10/2014 |
| WO | 2014168939 | A2 | 10/2014 |
| WO | 2014174283 | A1 | 10/2014 |
| WO | 2015200267 | A2 | 12/2015 |

OTHER PUBLICATIONS

International Search Report and Written Opinion, International Application No. PCT/US2014/033302, Nov. 7, 2014, 10 pages.
Bloom, I. and Nemirovsky, Y.; 1/ f Noise Reduction of Metal-Oxide-Semiconductor Transistors by Cycling from Inversion to Accumulation, Appl. Phys. Lett. 48 (15), Apr. 15, 1991, American Institute of Physics, pp. 1164-1666.
Koh, Jeongwook; Low-Frequency-Noise Reduction Technique for Linear Analog CMOS IC's, Dissertation, Lehrstuhl fur Technische Elektroniks der Technischen Universitat Munchen; 2005, 113 pages.
Kolhatkar, J.S., Salm, C., Knitel, M.J., and Wallinga, H.; Constant and Switched Bias Low Frequency Noise in p-MOSFETs with Varying Gate Oxide Thickness ESSDERC 2002, pp. 83-86.
Ersoy, Selcuk, Van Veldhoven, Robert H.M., Sebastiano, Fabio, Reimann, Klaus, Makinwa, Kofi A.A.; A 0.25mm2 AC-Biased MEMS Microphone Interface with 28dBA SNR, ISSCC 2013 / Session 22 / Sensors & Displays / 22.2, 2013 IEEE International Solid-State Circuits Conference, Digest of Technical Papers, Feb. 20, 2013, pp. 382-383.
International Search Report and Written Opinion, International Application No. PCT/GB2014/051262, Sep. 22, 2014, 18 pages.
Search Report under Section 17, GB Patent Application No. GB1307576.7, Oct. 9, 2013, 3 pages.
Zhou, et al., Precompensated excitation waveforms to suppress harmonic generation in MEMS electrostatic transducers, IEEE Transactions on Ultrasonics, Ferroelectrics and Frequency Control, vol. 51, Issue 11, Nov. 2004, pp. 1564-1574.
Jawed, Syed Arsalan, CMOS Readout Interfaces for MEMS Capacitive Microphones, Mar. 31, 2009, Retrieved from the Internet: http://eprints-phd.biblio.unitn.it/82/1/thesis_mems_microphone_readout.pdf.
O'Neal, J.B., Delta Modulation Quantizing Noise Analytical and Computer Simulation Results for Gaussian and Television Input Signals, Bell Systems Technical Journal, Jan. 1966, pp. 117-141.
International Search Report and Written Opinion, International Application No. PCT/US2015/037101, mailed Jan. 4, 2016, 20 pages.
Anonymous: Data compression—Wikipedia, the free encyclopedia, Jun. 17, 2014, Retrieved from the Internet: https://en.wikipedia.org/w/index.php?title=Data_compression&oldid=613257125 [retrieved on Oct. 5, 2015], pp. 1-3, 7-9.
Anonymous: Lossless compression—Wikipedia, the free encyclopedia, Jun. 18, 2014, Retrieved from the Internet: https://en.wikipedia.org/w/index.php?title=Lossless_compression&oldid=613463592 [retrieved on Oct. 5, 2015], pp. 2-3, 5-6.
Abadi et al., Integrating compression and execution in column-oriented database systems, ACM Proceedings of SIGMOD. International Conference on Management of Data, Jun. 27, 2006, pp. 671-682.
Combined Search and Examination Report under Sections 17 and 18(3), Application No. GB1511091.9, mailed Jan. 21, 2016, 8 pages.
International Search Report and Written Opinion, International Application No. PCT/US2015/037101, mailed Mar. 23, 2016, 23 pages.
Colodro, Francisco et al., New Continuous-Time Multibit Sigma-Delta Modulators with Low Sensitivity to Clock Jitter, IEEE Transactions on Circuits and Systems I: Regular Papers, IEEE, U.S. vol. 56, No. 1, Jan. 1, 2009, p. 74-83.
Muda, Lindasalwa et al., Voice Recognition Algorithms using Mel Frequency Ceptral Coefficient (MFCC) and Dynamic Time Warping (DTW) Techniques, Journal of Computing (vol. 2, Issue 3), Mar. 22, 2010, pp. 138-143.
Eshraghi, A et al., A Comparison of Three Parallel Delta-Sigma A/D Converters, 1996 IEEE International Symposium on Circuits and Systems (ISCAS), IEEE, U.S., May 12, 1996, pp. 517-520.

* cited by examiner

SYSTEMS AND METHODS FOR REDUCING NON-LINEARITIES OF A MICROPHONE SIGNAL

RELATED APPLICATIONS

The present disclosure claims priority to U.S. Provisional Patent Application Ser. No. 61/810,075, filed Apr. 9, 2013, which is incorporated by reference herein in its entirety.

FIELD OF DISCLOSURE

The present disclosure relates in general to audio systems, and more particularly, to reducing distortion of a microphone signal.

BACKGROUND

Microphones are ubiquitous on many devices used by individuals, including computers, tablets, smart phones, and many other consumer devices. Generally speaking, a microphone is an electroacoustic transducer that produces an electrical signal in response to deflection of a portion (e.g., a membrane or other structure) of a microphone caused by sound incident upon the microphone.

Traditionally, it has often been assumed that operation of a microphone is linear, such that the electrical signal generated by a microphone is a linear function of the sound pressure level incident upon the microphone. However, a microphone may operate with many non-linearities, including non-linear relationships of deflection as a function of sound pressure level. Left uncorrected, such non-linearities may cause distortion, in that the audio signal generated from a microphone may not be accurately representative of the actual sound incident upon the microphone.

SUMMARY

In accordance with the teachings of the present disclosure, certain disadvantages and problems associated with non-linear distortion of a microphone signal may be reduced or eliminated.

In accordance with embodiments of the present disclosure, a system may include a processor configured to couple to an audio transducer having a digital audio output signal indicative of audio sounds incident upon the audio transducer, wherein the digital audio output signal is a function of a displacement associated with the audio transducer. The processor may also be configured to, based on the digital audio output signal or a derivative thereof and a displacement non-linearity function associated with the audio transducer, generate a modified digital audio output signal, wherein the displacement non-linearity function is a function of the digital audio output signal and has a response modeling non-linearities of the displacement as a function of a sound pressure level incident upon the audio transducer.

In accordance with these and other embodiments of the present disclosure, a method may include receiving from an audio transducer a digital audio output signal indicative of audio sounds incident upon the audio transducer, wherein the digital audio output signal is a function of a displacement associated with the audio transducer. The method may also include, based on the digital audio output signal or a derivative thereof and a displacement non-linearity function associated with the audio transducer, generating a modified digital audio output signal, wherein the displacement non-linearity function is a function of the digital audio output signal and has a response modeling non-linearities of the displacement as a function of a sound pressure level incident upon the audio transducer.

Technical advantages of the present disclosure may be readily apparent to one having ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are explanatory examples and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
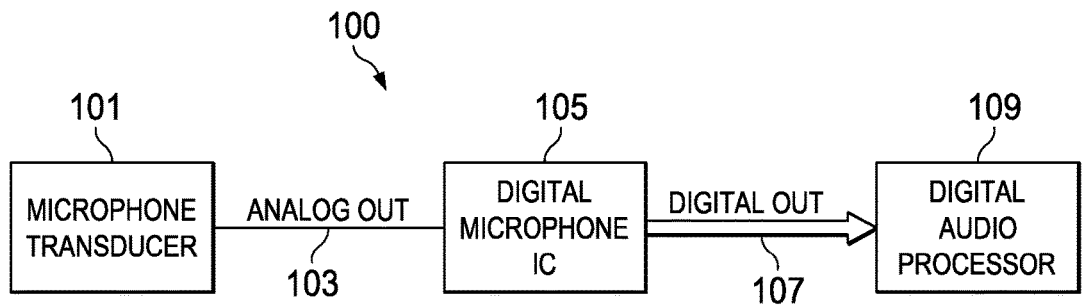
FIG. 1 illustrates a block diagram of selected components of an example audio system, in accordance with embodiments of the present disclosure.

FIG. 1 illustrates a block diagram of selected components of an example audio system 100, in accordance with embodiments of the present disclosure. As shown in FIG. 1, audio system 100 may include a microphone transducer 101, a digital microphone integrated circuit (IC) 105, and a digital audio processor 109. Microphone transducer 101 may comprise any system, device, or apparatus configured to convert sound incident at microphone transducer 101 to an electrical signal, for example analog output signal 103, wherein such sound is converted to an electrical signal using a diaphragm or membrane having an electrical capacitance that varies as based on sonic vibrations received at the diaphragm or membrane. Microphone transducer 101 may include an electrostatic microphone, a condenser microphone, an electret microphone, a microelectromechanical systems (MEMs) microphone, or any other suitable capacitive microphone.

Digital microphone IC 105 may comprise any suitable system, device, or apparatus configured to process analog output signal 103 to generate a digital audio output signal 107 and condition digital audio output signal 107 for transmission over a bus to digital audio processor 109. Once converted to digital audio output signal 107, the audio signal may be transmitted over significantly longer distances without being susceptible to noise as compared to an analog transmission over the same distance. In some embodiments, digital microphone IC 105 may be disposed in close proximity with microphone transducer 101 to ensure that the length of the analog line between microphone transducer 101 and digital microphone IC 105 is relatively short to minimize the amount of noise that can be picked up on an analog output line carrying analog output signal 103. For example, in some embodiments, microphone transducer 101 and digital microphone IC 105 may be formed on the same integrated circuit die or substrate.

Digital audio processor 109 may comprise any suitable system, device, or apparatus configured to process digital audio output signal 107 for use in a digital audio system. For example, digital audio processor 109 may comprise a microprocessor, microcontroller, digital signal processor (DSP), application specific integrated circuit (ASIC), or any other device configured to interpret and/or execute program instructions and/or process data, such as digital audio output signal 107.

Figure 2:
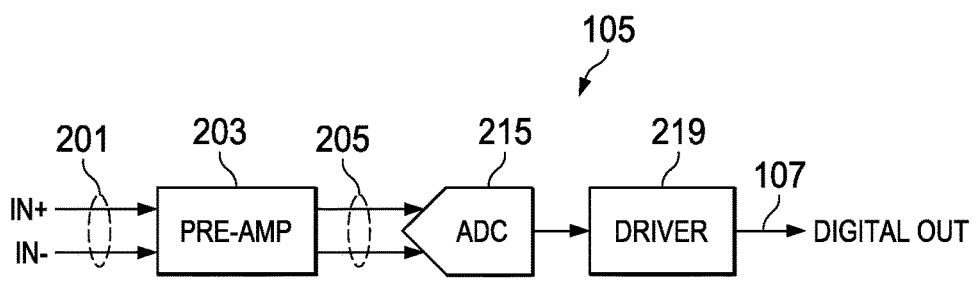
FIG. 2 illustrates a block diagram of selected components of a digital microphone integrated circuit, in accordance with embodiments of the present disclosure.

FIG. 2 illustrates a block diagram of selected components of digital microphone IC 105, in accordance with embodiments of the present disclosure. As shown in FIG. 2, digital microphone IC 105 may include a pre-amplifier 203, an analog-to-digital converter (ADC) 215, and a driver 219. Pre-amplifier 203 may receive analog output signal 103 via one or more input lines 201 which may allow for receipt of a single-ended signal, differential signal, or any other suitable analog audio signal format and may comprise any suitable system, device, or apparatus configured to condition analog output signal 103 for processing by ADC 215. The output of pre-amplifier 203 may be communicated to ADC 215 on one or more output lines 205.

ADC 215 may comprise any suitable system device or apparatus configured to convert an analog audio signal received at its input, to a digital signal representative of analog output signal 103. ADC 215 may itself include one or more components (e.g., delta-sigma modulator, decimator, etc.) for carrying out the functionality of ADC 215.

Driver 219 may receive the digital signal output by ADC 215 and may comprise any suitable system, device, or apparatus configured to condition such digital signal (e.g., encoding into AES/EBU, S/PDIF, or other suitable audio interface standards), in the process generating digital audio output signal 107 for transmission over a bus to digital audio processor 109. In FIG. 2, the bus receiving digital audio output signal 107 is shown as single-ended. In some embodiments, driver 219 may generate a differential digital audio output signal 107.

Figure 3:
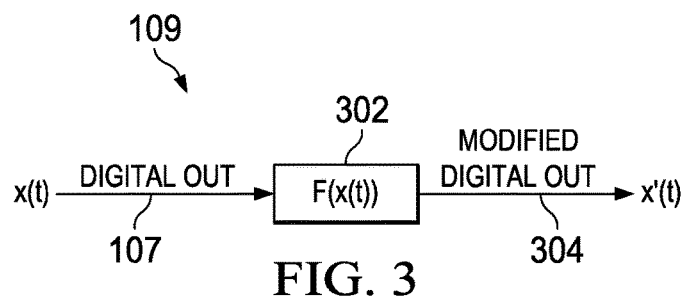
FIG. 3 illustrates a block diagram of selected functional blocks of a digital audio processor, in accordance with embodiments of the present disclosure.

FIG. 3 illustrates a block diagram of selected functional blocks of a digital audio processor 109, in accordance with embodiments of the present disclosure. As shown in FIG. 3, digital audio processor 109 may include a filter with a response $F(x(t))$. Response $F(x(t))$ is a microphone non-linearity function that is a function of digital output audio signal 107 (represented by $x(t)$ in FIG. 3) and models non-linearities of the displacement of microphone transducer 101 as a function of a sound pressure level incident upon microphone transducer 101. For example, response $F(x(t))$ may combine non-linearities (e.g., force factor, stiffness) of microphone 101 into a single scaling factor which is a function of a digital audio signal $x(t)$. Accordingly, responsive to digital audio output signal 107 ($x(t)$), filter 302 may generate a modified digital audio output signal 304 ($x'(t)$).

In some embodiments, microphone non-linearity function $F(x(t))$ may be characterized using offline testing of one or more microphones similar to the microphone transducer 101. For example, in such embodiments, microphone non-linearity function $F(x(t))$ may be determined by observing an actual digital audio output signal $x(t)$ in response to a particular sound (e.g., pink noise) incident on microphone transducer 101 to determine any non-linear response of the digital audio output signal to the incident sound. In addition or alternatively, such testing may be applied to many microphones similar or identical in design to microphone transducer 101 (e.g., the same model as microphone transducer 101), such that response $F(x(t))$ is based on an average of similar or identical microphone transducers.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend.

Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

What is claimed is:

1. A system comprising:
    a processor configured to:
        couple to an audio transducer having a digital audio output signal indicative of audio sounds incident upon the audio transducer, wherein the digital audio output signal is a function of a displacement associated with the audio transducer; and
        based on the digital audio output signal or a derivative thereof and a displacement non-linearity function associated with the audio transducer, generate a modified digital audio output signal, wherein the displacement non-linearity function is a function of the digital audio output signal and has a response modeling non-linearities of the displacement as a function of a sound pressure level incident upon the audio transducer.

2. The system of claim 1, wherein the audio transducer comprises a microphone.

3. The system of claim 2, wherein the microphone comprises a microelectromechanical systems microphone.

4. The system of claim 1, wherein the displacement non-linearity function is based on offline testing of one or more audio transducers similar to the audio transducer.

5. The system of claim 1, wherein the digital audio input signal is a digital signal based on an analog signal generated by the audio transducer.

6. A method comprising:
    receiving from an audio transducer a digital audio output signal indicative of audio sounds incident upon the audio transducer, wherein the digital audio output signal is a function of a displacement associated with the audio transducer; and
    based on the digital audio output signal or a derivative thereof and a displacement non-linearity function associated with the audio transducer, generating a modified digital audio output signal, wherein the displacement non-linearity function is a function of the digital audio output signal and has a response modeling non-linearities of the displacement as a function of a sound pressure level incident upon the audio transducer.

7. The method of claim 6, wherein the audio transducer comprises a microphone.

8. The method of claim 7, wherein the microphone comprises a microelectromechanical systems microphone.

9. The method of claim 6, wherein the displacement non-linearity function is based on offline testing of one or more audio transducers similar to the audio transducer.

10. The method of claim 6, wherein the digital audio input signal is a digital signal based on an analog signal generated by the audio transducer.

* * * * *